United States Patent [19]

McCaslin

[11] Patent Number: 5,036,294

[45] Date of Patent: Jul. 30, 1991

[54] PHASE LOCKED LOOP HAVING LOW-FREQUENCY JITTER COMPENSATION

[75] Inventor: Shawn R. McCaslin, Cedar Creek, Tex.

[73] Assignee: Motorola Inc., Schaumburg, Ill.

[21] Appl. No.: 620,686

[22] Filed: Dec. 3, 1990

[51] Int. Cl.$^5$ ............................................ H03L 7/093
[52] U.S. Cl. ...................................... 331/1 A; 331/17; 375/120
[58] Field of Search ...................... 331/1 A, 17, 18, 25; 375/120; 455/260

[56] References Cited

U.S. PATENT DOCUMENTS

| | | | |
|---|---|---|---|
| 4,941,156 | 3/1989 | Stern et al. | 375/118 |
| 4,942,370 | 7/1990 | Shigemori | 331/17 X |
| 4,942,371 | 7/1990 | Kashiwaba et al. | 331/14 |

Primary Examiner—David Mis
Attorney, Agent, or Firm—Robert L. King

[57] ABSTRACT

A phase locked loop circuit generates an output clock that is in phase with a reference clock and is frequency jitter compensated at lower frequencies by translating intrinsic jitter frequency from low frequency to a predetermined range of higher frequencies. The phase locked loop circuit utilizes dithering circuitry to control a switched capacitor network in order to reduce the magnitude of the frequency jitter at lower frequencies. A phase detector and a loop filter of the phase locked loop circuit are implemented using digital circuitry. An oscillator of the phase locked loop is an analog oscillator which is digitally controlled and includes the switched capacitor network. Quantization error in the output clock is minimized by switching an LSB weighted capacitor in the oscillator at a frequency established by the dithering circuitry.

8 Claims, 2 Drawing Sheets

PHASE LOCKED LOOP HAVING LOW-FREQUENCY JITTER COMPENSATION

FIELD OF THE INVENTION

This invention relates generally to phase locked loop circuits, and more particularly, to phase locked loop circuits with frequency jitter compensation.

BACKGROUND OF THE INVENTION

A common method of generating a high frequency system clock from a low frequency reference clock is through the use of a phase locked loop circuit. There are various methods of implementing a phase locked loop circuit, but all phase locked loop circuits have three essential portions: a phase detector portion, a loop filter portion, and a voltage controlled oscillator portion. The phase detector portion has a first input for receiving a reference clock signal, and a second input for receiving the output of the voltage controlled oscillator portion. The output of the voltage controlled oscillator portion is also the output of the phase locked loop circuit. The phase detector portion has an output that is connected to an input of the loop filter portion, and the loop filter portion has an output that is connected to an input of the voltage controlled oscillator portion.

In operation, the output of the phase detector portion provides a signal which is proportional to any phase difference between the two signals at the two inputs mentioned above. In response to the phase detector portion, the loop filter portion provides an output signal that is a function of the input signal from the phase detector portion. The voltage controlled oscillator portion provides an output frequency that is proportional to the output of the loop filter portion. As mentioned above, the output signal of the voltage controlled oscillator portion is connected back to the second input of the phase detector portion as feedback information. The feedback information is necessary in order for the output signal of the voltage controlled oscillator portion to phase lock with the reference clock signal.

Depending on the application, each of the portions of the phase locked loop circuit is intentionally implemented by using specific digital or analog circuits. For example, a phase locked loop circuit that is implemented using a digital phase detector, a digital loop filter and a digitally controlled oscillator has an advantage of improved operating stability with respect to temperature and supply voltage variations as compared to an analog implementation. However, a digitally controlled oscillator has a potential disadvantage in that an additional clocking signal that is higher in frequency than the phase locked loop circuit frequency is required to control only the digitally controlled oscillator.

Another common phase locked loop implementation utilizes a digital phase detector, an analog loop filter, and an analog voltage controlled oscillator. An advantage to this implementation is that the analog voltage controlled oscillator does not require a separate higher frequency clock. A possible disadvantage is that the analog loop filter implementation requires capacitive and resistive components external to the phase locked loop circuit that add cost and reduce reliability.

In general, by implementing the various components using digital circuitry, as opposed to analog circuitry, a more stable circuit design is achieved. In contrast, an analog implementation of a phase locked loop circuit has the advantages of avoiding quantization errors associated with conversion to digital quantities and avoiding frequency aliasing errors associated with digital design techniques. Also, in a completely analog phase locked loop circuit, a higher operating frequency may be obtained for a crystal of predetermined frequency as compared with a completely digital phase locked loop circuit.

Phase locked loop circuits are implemented using a proportional-integral control term method. Each control term provides a specific effect on the performance of the phase locked loop circuit. The proportional term determines, in part, a dampening factor of the phase locked loop circuit. The integral term compensates for a frequency offset error in the phase locked loop circuit.

Phase locked loop circuits are commonly utilized in a high performance telecommunication transceiver within a telecommunication system, where a transceiver is a telecommunication device that can both transmit and receive data bit information. A primary reason why a phase locked loop circuit is used within a high performance telecommunication transceiver is to provide data-clock synchronization between a transmitter and a receiver. Failure to establish data-clock synchronization can cause "cycle slip". When cycle-slip occurs, some data bits being transmitted are not received by another transceiver within the telecommunication system, and the data bits that are not received as a result of cycle-slip are said to have been dropped or ignored.

A common problem associated with phase locked loop circuits is an intrinsic frequency jitter at the output, where frequency jitter is a deleterious variation in the output frequency. Not all applications of phase locked loop circuits are sensitive to frequency jitter; however, frequency jitter is a primary concern in telecommunications.

In telecommunication systems that utilize high performance transceivers, data signal processing techniques are utilized. These data signal processing techniques require that the magnitude of the frequency jitter be at a minimum. For example, the frequency jitter tolerance of such a high performance telecommunication system, like a U-transceiver, is specified by an international standards committee, ANSI, and is illustrated in FIG. 1. The graph of FIG. 1 illustrates the magnitude of the output frequency jitter as measured in picoseconds, on the vertical axis, as a function of frequency, on the horizontal axis. The graph demonstrates that as frequency increases, the magnitude of the allowed frequency jitter also increases, and as frequency decreases, the magnitude of the allowed frequency jitter decreases.

A first order phase locked loop circuit has a loop filter portion with only a proportional control term. Therefore, wider noise bandwidth exists in the phase locked loop circuit, and any noise or jitter in the input reference signal is not filtered. A known method of reducing the frequency jitter at the output of a first order phase locked loop circuit is to control the output frequency via a number of ratioed switchable capacitors at the output of a crystal oscillator circuit. The switched capacitors are controlled directly by the output of a phase detector. In such a circuit, magnitude of the frequency jitter can be forcibly or 'hard' limited to a predetermined value by limiting the maximum frequency that the oscillator can produce to the predetermined value. A disadvantage to conventional first order phase locked loop circuits using ratioed switched capacitors at the output is that the frequency offset compensation of the phase locked loop is limited.

SUMMARY OF THE INVENTION

There is provided herein a phase locked loop having low-frequency jitter compensation having a phase detector implemented with digital circuitry. The phase detector has a first input for receiving a first clock signal which is a reference signal, and has a second input for receiving an output signal of the phase locked loop. An output of the phase detector indicates a phase relationship between the first and second clock signals. A digital filter circuit has an input coupled to the output of the phase detector. The digital filter circuit generates a proportional term and an integral control term and sums the proportional control term and the integral control term to provide a digital signal. The digital signal represents a filtered output defining how to adjust the output signal of the phase locked loop circuit to maintain a predetermined output frequency. A digitally controlled analog oscillator is coupled to the digital filter circuit for providing the output signal in response to the digital signal of the filter.

DESCRIPTION OF A PREFERRED EMBODIMENT

Figure 2:
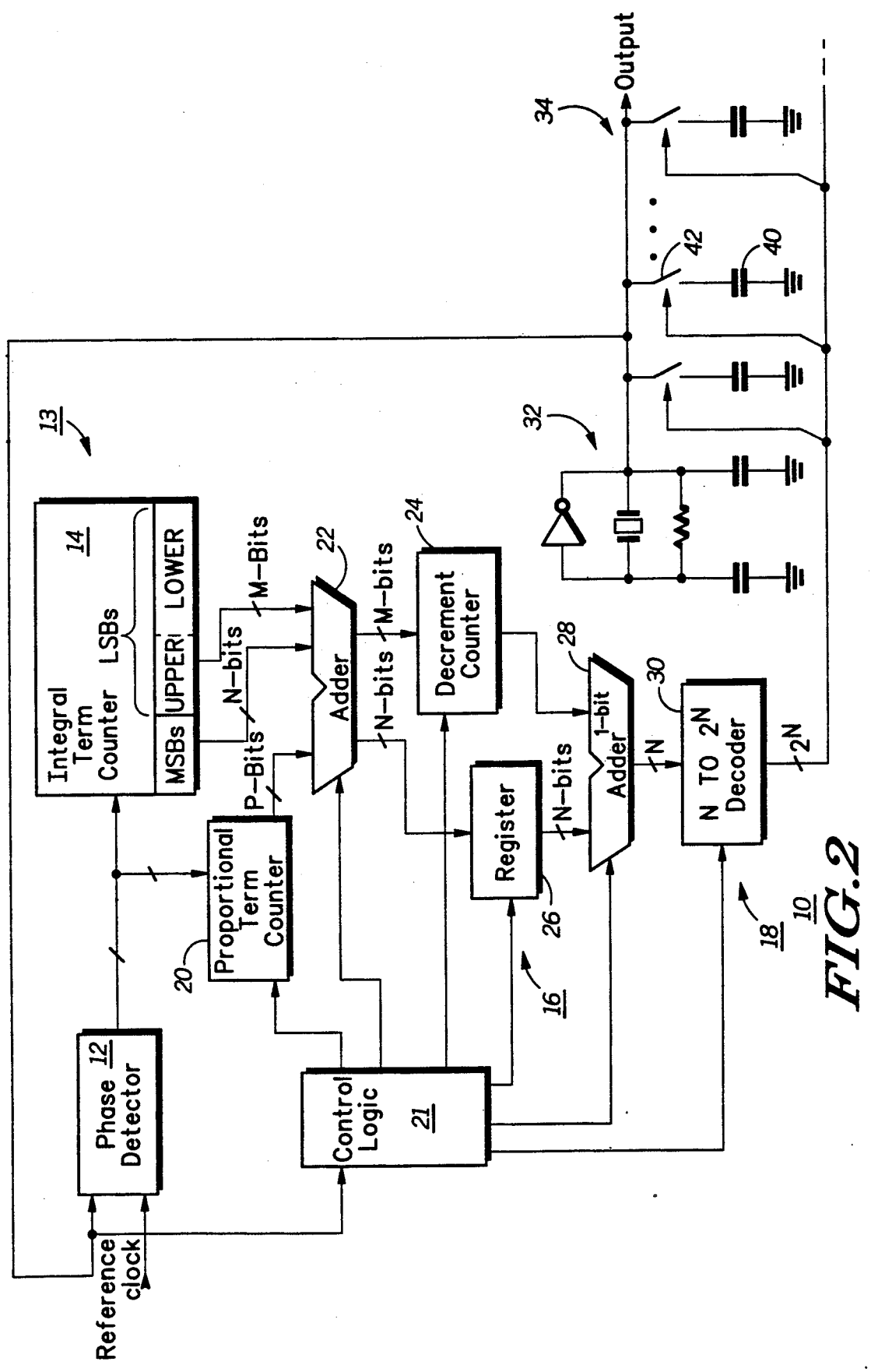
FIG. 2 illustrates in block diagram form a phase locked loop circuit in accordance with the present invention.

Illustrated in FIG. 2 is a switched capacitor phase locked loop 10 having frequency jitter compensation at low frequencies. Phase locked loop 10 generally has a phase detector 12, a loop filter portion 13, a dither portion 16, a digitally controlled analog oscillator portion 18, and control logic 21. Loop filter portion 13 has an integral term counter 14, a proportional term counter 20, and an adder 22. Dither portion 16 has a decrement counter 24, a register 26, and an adder 28. Digitally controlled analog oscillator portion 18 has an N to $2^N$ decoder 30, a crystal oscillator portion 32, and a switched capacitor network 34.

Control logic 21 has an input to receive an output signal of the digitally controlled analog oscillator portion 18. Control logic 21 has a first output that is connected to a control input of proportional term counter 20, a second output that is connected to a control input of adder 22, a third output that is connected to a control input of decrement counter 24, a fourth output that is connected to a control input of register 26, a fifth output that is connected to a control input of adder 28, and a sixth output that is connected to a control input of decoder 30. Phase detector 12 has a first input connected to a reference clock signal, and a second input for receiving an output of the digitally controlled analog oscillator portion 18. The output of the digitally controlled analog oscillator portion 18 is also the output of the phase locked loop 10. Phase detector 12 has an output that is connected to both an input of integral term counter 14 and an input of proportional term counter 20. Integral term counter 14 has an output that is divided into N and M-bits, where N and M are integers. Proportional term counter 20 has a P-bit output that is connected to a first input of adder 22. Adder 22 has second and third inputs for respectively receiving the concatenated N and an M-bit outputs of integral term counter 14, and provides an N and M-bit output. Decrement counter 24 has an input to receive the M-bit output of adder 22, and provides a single bit output. Register 26 has an input to receive the N-bit output of adder 22, and provides an N-bit output. Adder 28 has a first input to receive the N-bit output of register 26, and a second input to receive the single bit output of decrement counter 24. Adder 28 has an N-bit output that is connected to an input of decoder 30. Decoder 30 has a $2^N$ bit output. A predetermined one of each of the $2^N$ bits is connected to a control terminal of a predetermined one of a plurality of switches of the switched capacitor network 34. Crystal oscillator portion 32 is a conventional crystal oscillator utilizing an inverter, a crystal, a resistor, and capacitors. Switched capacitor network 34, which has an output labeled "Output," has a plurality of equal valued capacitors. Each capacitor is coupled to one of the plurality of switches, such as capacitor 40 being coupled to switch 42. All of the switches within switched capacitor network 34 has a first terminal connected together to form the output of switched capacitor network 34 and phase locked loop 10. Each switch within switched capacitor network 34 has a second terminal that is each connected to a predetermined first electrode of a capacitor within the plurality of switched capacitors. Each switch within switched capacitor network 34 has a control terminal connected to the output of decoder 30. A second electrode of each capacitor, within switched capacitor network 34, is connected to a ground reference. It should be noted that in a preferred form of implementation the capacitors of switched capacitor network 34 are physically distributed about crystal oscillator portion 32 to distribute the capacitance on both sides of the crystal and assist the crystal during startup operation. For convenience of illustrating the present invention, all capacitors of switched capacitor network 34 are shown only on one side of crystal oscillator portion 32.

Phased locked loop 10 provides an output frequency that is proportional to the reference frequency input. Phase locked loop 10 also minimizes the effects of frequency jitter at lower frequencies by using a dithering technique to translate low-frequency intrinsic jitter to a higher frequency jitter where the magnitude of the frequency jitter is more tolerated.

In operation, phase detector 12, which is implemented digitally, provides an output signal that is proportional to any phase difference which exists between the reference clock and the output of switched capacitor network 34. The digital output of phase detector 12 provides a signal to loop filter portion 13 which indicates to either increase or decrease the output frequency provided by switched capacitor network 34. Proportional term counter 20, integral term counter 14 and adder function collectively to implement a loop filter which provides a digital output which further defines how to correct any phase error in the output of phase lock loop 10. Proportional term counter 20 is implemented as a digital counter and is reset by control logic 21 at predetermined time intervals. Integral term counter 14 is implemented as a digital up/down counter, and the decision whether to increment or decrement the counter is governed by the output from phase detector 12. The N-bit output of integral term counter 14 represents a predetermined number of most significant bits (MSBs) from the output of the up/down count function. The M-bit outputs of integral term counter 14 represent a predetermined upper portion of the least significant bits (LSBs) from the output of the up/down count function. The output of adder 22 is a digital signal representing a digital sum containing control terms related to integral and proportional control of the output frequency in accordance with conventional control theory. The digital sum provided by adder 22 is a filtered output further defining how to correct the output signal of phase locked loop 10 in a conventional manner.

In the illustrated form, the present invention provides an alternative to the previously mentioned known hard limited frequency jitter first-order phase locked loop circuit by the addition of digital integral term counter 14 between phase detector 12 and the analog digitally controlled oscillator 34. This addition converts the first order phase locked loop into a second order phase locked loop. By providing a digital count value in response to the phase difference, the integral term counter 14 is effectively integrating the output of phase detector 12 and filters out jitter on the reference clock without limiting the frequency-offset compensation ability of the phase locked loop. A loop filter also reduces the noise bandwidth of the phase locked loop. The digital loop filter output is used to adjust the frequency of the analog digitally controlled oscillator via a set of switchable capacitors at the output of the crystal oscillator portion 32. Each of the capacitors of switched capacitor network 34 is equal valued so that network 34 is monotonic. The number of switchable capacitors determines the number of frequency steps (frequency quantization) available, and smaller frequency quantization steps results in smaller changes in output frequency. Smaller changes in frequency at the output of the voltage controlled oscillator have the effect of reducing the magnitude of the intrinsic frequency jitter. The ability to reduce the frequency jitter is therefore dependent on the ability to manufacture small switchable capacitors. Since there is a physical limit to the size and number of ratioed switchable capacitors that can be manufactured practically on an integrated circuit, other methods of reducing frequency jitter are desired. The present invention provides a digital phase detector, a digital loop filter and an analog oscillator. This unique combination of digital and analog circuitry in a phase locked loop optimizes overall PLL performance by reducing the number and amount of external circuitry and providing accurate operation without requiring a separate high frequency clock signal in the oscillator stage.

In further accordance with the present invention, a dither term can be added to the digital output of the loop filter as an additional jitter control. If the magnitude of the dither is made to vary between zero and one LSB of the control signal to the capacitor array at the output of adder 28, proportional to the LSBs of the loop filter output, the resolution of the frequency control can be improved, thereby reducing quantization effects. The dither term is provided by decrement counter 24, register 26, and adder 28.

Figure 1:
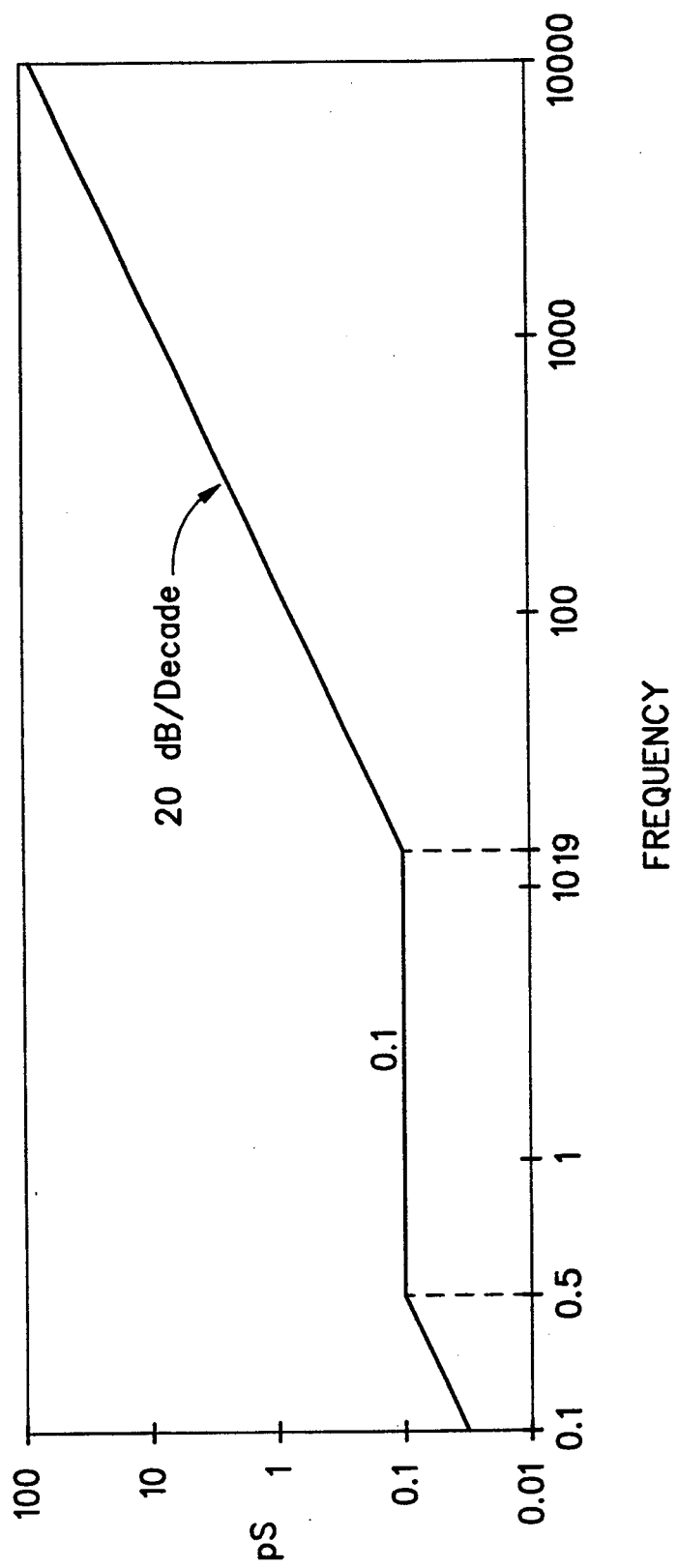
FIG. 1 illustrates in graphical form a graph of a conventional frequency jitter standard.

Decrement counter 24 latches the M-bit digital output of adder 22 and proceeds to decrement the latched value to zero. The rate at which counter 24 decrements is preferably $[2^M f_c]$ where "$f_c$" is a carrier frequency and is the frequency of the digital output of counter 24. During the time in which the latched value within decrement counter 24 is non-zero, the output of decrement counter 24 is a logic one; otherwise, the output value is a logic zero. Register 26 latches the N-bit output of adder 22, and at a predetermined time the output value of both register 26 and decrement counter 24 are presented to the input of adder 28. The N-bit output of adder 28 provides an encoded bit pattern based on the duty cycle output of decrement counter 24 and the N-bit value latched within register 26. The output of adder 28 has the effect of transferring the intrinsic low frequency jitter into a higher frequency jitter without increasing the magnitude of the frequency jitter. This procedure is called "dithering." The frequency range to which the output jitter is translated is approximately the carrier frequency established by control logic 21. Neither the carrier frequency nor ($2^M$) times the carrier frequency are particularly high frequencies. For example, as shown in FIG. 1 a carrier frequency in the range of 1 KHz allows significantly more jitter tolerance than in the one Hertz range. For this carrier frequency value, the frequency which decrement counter 24 is clocked is also not extremely high. For example, where M is equal to six designating a six bit output from adder 22 and the carrier frequency is 1 KHz, decrement counter 24 is clocked at 64 KHz. The N-bit output of adder 28 is decoded into $2^N$ control signals by decoder 30. Each of the $2^N$ signals controls a predetermined switch within switched capacitor network 34 to adjust the output frequency of the crystal oscillator portion 32.

Another way of considering the effect on the output frequency of the PLL which dither portion 16 contributes is to consider the fact that because each capacitor has an LSB value, a fine tuning of the output frequency is provided by switching in or out of the output an LSB weighted capacitor. Further, since the output carrier frequency of adder 28 is high, the LSB tuning of the output frequency occurs very frequently. Therefore, quantization error in the output is averaged and reduced by a high rate of LSB correction of the output frequency.

By now it should be apparent that there has been provided a phase locked loop circuit utilizing both a digital phase detector and loop filter, along with a digitally controlled analog oscillator to provide for an improved frequency resolution along with guaranteed monotonic frequency control and low frequency jitter compensation. The digital implementation of the phase detector and loop filter is less sensitive to circuit aging characteristics, variations in temperature and supply voltage, manufacturing anomalies, and is less costly as compared to various analog implementations.

It should be well understood that although the above described phase locked loop circuit is implemented as illustrated in FIG. 1, other ways of dithering or translating the low frequency jitter to a higher frequency jitter may be utilized. Although a specific number of capacitors is shown in the analog digitally controlled oscillator, it should be well understood that any number of capacitors may be implemented. While a capacitor array having equal valued capacitors is shown, it should be apparent that the present invention may also be implemented with binarily weighted capacitor values. Although the use of equal valued capacitors guarantees monotonicity, output voltage errors may result from the switching action of the capacitors when the capacitors are not equal valued. If an output error from capacitor switching of differing voltage levels can be tolerated, then monotonicity is not required.

While there have been described herein the principles of the invention, it is to be clearly understood to those skilled in the art that this description is made only by way of example and not as a limitation to the scope of the invention. Accordinglu, it is intended, by the appended claims, to cover all modifications of the invention which fall within the true spirit and scope of the invention.

I claim:

1. A phase locked loop, comprising:
   a phase detector implemented with digital circuitry having a first input for receiving a first clock signal which is a reference signal, a second input for receiving an output signal of the phase locked loop, and an output indicating a phase relationship between the first and second clock signals;
   a digital filter circuit having an input coupled to the output of the phase detector, the digital filter circuit generating a proportional control term and an integral control term, summing the proportional control term and the integral control term to provide a digital signal representing a filtered output defining how to adjust the output signal of the phase locked loop circuit to maintain a predetermined output frequency; and
   a digitally controlled analog oscillator coupled to the digital filter circuit for providing the output signal in response to the digital signal of the filter.

2. The phase locked loop of claim 1 further comprising:
   dither means coupled between the digital filter circuit and the digitally controlled analog oscillator for receiving the digital signal provided by the digital filter circuit and processing the digital signal to provide a digital control signal to the analog oscillator as the digital signal, said digital control signal translating an intrinsic low frequency jitter in the output frequency signal to a predetermined higher frequency.

3. The phase locked loop of claim 2 wherein said dither means further comprise:
   a counter having an input coupled to the digital signal of the digital filter circuit for receiving a less significant portion of the digital signal, said counter counting from a value established by the received less significant portion of the digital signal to a predetermined value while providing an output of a first logic value, said output changing to a second logic value upon reaching the predetermined value, said counter having a clock input for receiving a clock signal;
   storage means having an input coupled to the digital signal of the digital filter circuit for receiving and storing a more significant portion of the digital signal, and having an output for selectively providing the more significant portion of the digital signal;
   an adder having a first input coupled to the output of the storage means, a second input coupled to the output of the counter, and an output for providing the digital control signal in response to adding the more significant portion of the digital signal and the output of the counter; and
   control means coupled to the counter for providing the clock signal, said clock signal determining the predetermined higher frequency which the low frequency jitter is translated to, said control means being further coupled to the storage means and the adder for controlling the storage means and the adder.

4. The phase locked loop of claim 3 wherein said counter further comprises a decrement counter and counts from the value established by the received less significant portion of the digital signal down to zero before being reset by the control means and repeating said counting and reset operation.

5. A phase locked loop having frequency jitter compensation at low frequencies, comprising:
   a phase detector implemented with digital circuitry having a first input for receiving a first clock signal which is a reference signal, a second input for receiving a second clock signal which is a frequency multiple of a predetermined output frequency signal, and an output indicating a phase relationship between the first and second clock signals;
   a digital filter circuit having an input coupled to the output of the phase detector, the digital filter circuit providing a digital signal having a most significant bit (MSB) portion and a least significant bit (LSB) portion, said digital filter providing a digital filter signal for compensating frequency variations in the output frequency signal;
   dither means coupled to the most significant bit and least significant bit portions of the digital filter signal of the digital filter circuit, the dither means providing a digital control signal in response to the digital signal; and
   a digitally controlled switched capacitor analog oscillator coupled to the control signal of the dither means for providing the predetermined output frequency signal, the output frequency signal having an intrinsic frequency jitter and minimized quantization noise, said control signal controlling the analog oscillator by translating the intrinsic frequency jitter to a predetermined higher frequency by switching a predetermined capacitor with an LSB weight to dither intrinsic frequency jitter of the output frequency signal at substantially the predetermined higher frequency.

6. The phase locked loop of claim 5 wherein said digitally controlled switched capacitor analog oscillator further comprises:
   a crystal oscillator circuit for providing the output frequency signal at an output terminal; and
   a plurality of equal valued capacitors selectively coupled to the output terminal in response to the digital control signal, said capacitors selectively adjusting the output frequency signal.

7. A method of reducing frequency jitter in a phase locked loop at low frequencies, comprising the steps of:
   providing a phase detector having a first input for receiving a first clock signal which is a reference signal, a second input for receiving a second clock signal which is a frequency multiple of a predetermined output frequency signal, and an output indicating a phase relationship between the first and second clock signals;
   coupling an input of a digital filter circuit to the output of the phase detector, the digital filter circuit providing a digital signal having a most significant bit (MSB) portion and a least significant bit (LSB) portion, said digital filter providing a digital filter signal for compensating frequency variations in the output frequency signal;
   coupling dither means to the most significant bit and least significant bit portions of the digital filter signal of the digital filter circuit, the dither means providing a digital control signal in response to the digital signal; and coupling a switched capacitor analog oscillator to the digital control signal of the dither means for providing the predetermined output frequency signal, the output frequency signal having an intrinsic frequency jitter and minimized quantization noise, and controlling the analog oscillator by translating the intrinsic frequency jitter to a predetermined higher frequency by switching a predetermined capacitor with an LSB weight to dither intrinsic frequency jitter of the output frequency signal at substantially the predetermined higher frequency.

8. The method of claim 7 wherein said step of coupling a switched capacitor analog oscillator to the dither means further comprises the steps of:

providing a crystal oscillator circuit to generate the output frequency signal at an output terminal; and selectively coupling one or more of a plurality of equal valued capacitors to the output terminal in response to the digital control signal, said capacitors selectively adjusting the output frequency signal.

* * * * *